(12) United States Patent
Janssen et al.

(10) Patent No.: US 8,451,423 B2
(45) Date of Patent: May 28, 2013

(54) LITHOGRAPHIC APPARATUS AND METHOD

(75) Inventors: Franciscus Johannes Joseph Janssen, Eindhoven (NL); Siebe Landheer, Eindhoven (NL); Yücel Kök, Veldhoven (NL); Marcel Beckers, Eindhoven (NL); Ivo Adam Johannes Thomas, Son (NL); Marcio Alexandre Cano Miranda, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 530 days.

(21) Appl. No.: 12/486,425

(22) Filed: Jun. 17, 2009

(65) Prior Publication Data

US 2009/0316121 A1    Dec. 24, 2009

Related U.S. Application Data

(60) Provisional application No. 61/129,314, filed on Jun. 18, 2008.

(51) Int. Cl.
   *G03B 27/32* (2006.01)
   *G03B 27/42* (2006.01)
   *G03B 27/52* (2006.01)
   *G03B 27/58* (2006.01)

(52) U.S. Cl.
   USPC .................... 355/30; 355/53; 355/72; 355/77

(58) Field of Classification Search
   USPC ..................... 355/30, 53, 67, 77; 359/820
   See application file for complete search history.

(56) References Cited

U.S. PATENT DOCUMENTS

| 4,509,852 | A | 4/1985 | Tabarelli et al. |
| 7,304,715 | B2 | 12/2007 | Cadee et al. |
| 7,738,074 | B2 | 6/2010 | Streefkerk et al. |
| 2004/0136494 | A1 | 7/2004 | Lof et al. |
| 2004/0207824 | A1 | 10/2004 | Lof et al. |
| 2005/0179877 | A1* | 8/2005 | Mulkens et al. ............. 355/30 |
| 2006/0033892 | A1* | 2/2006 | Cadee et al. ................ 355/30 |
| 2006/0033898 | A1 | 2/2006 | Cadee et al. |

(Continued)

FOREIGN PATENT DOCUMENTS

| EP | 1420300 A2 | 5/2004 |
| EP | 1 713 115 A1 | 10/2006 |

(Continued)

OTHER PUBLICATIONS

European Search Report for European Application No. EP 09 16 0135 dated Sep. 3, 2009.

(Continued)

*Primary Examiner* — Hung Henry Nguyen
*Assistant Examiner* — Colin Kreutzer
(74) *Attorney, Agent, or Firm* — Pillsbury Winthrop Shaw Pittman LLP (57) ABSTRACT

A lithographic apparatus of the immersion type is disclosed. In the apparatus, a plurality of heating and/or cooling devices are provided in the vicinity of the final element of the projection system, e.g. in a barrier member of a liquid handling system. The heating and/or cooling devices can be used, for example, to control temperature gradients in the final element of the projection system to control aberrations therein.

30 Claims, 6 Drawing Sheets

U.S. PATENT DOCUMENTS

| | | |
|---|---|---|
| 2006/0038968 A1 | 2/2006 | Kemper et al. |
| 2006/0087630 A1* | 4/2006 | Kemper et al. ............... 355/30 |
| 2006/0119809 A1 | 6/2006 | Verhagen et al. |
| 2006/0158627 A1 | 7/2006 | Kemper et al. |
| 2007/0243329 A1 | 10/2007 | De Graaf |
| 2007/0258060 A1 | 11/2007 | Chen et al. |
| 2008/0106707 A1 | 5/2008 | Kobayashi et al. |
| 2008/0212046 A1 | 9/2008 | Riepen et al. |
| 2009/0135385 A1* | 5/2009 | Gellrich et al. ............... 355/30 |
| 2009/0279060 A1 | 11/2009 | Direcks et al. |
| 2010/0060868 A1 | 3/2010 | Tanasa et al. |

FOREIGN PATENT DOCUMENTS

| | | |
|---|---|---|
| JP | 2005-051231 | 2/2005 |
| JP | 2005-252247 | 9/2005 |
| JP | 2005-353820 | 12/2005 |
| JP | 2006-054468 | 2/2006 |
| JP | 2007-184336 | 7/2007 |
| WO | 99/49504 A1 | 9/1999 |
| WO | 2005/038888 | 4/2005 |
| WO | 2005/064405 A2 | 7/2005 |
| WO | 2006/101120 | 9/2006 |
| WO | WO 2007/128835 A1 | 11/2007 |

OTHER PUBLICATIONS

Japanese Office Action mailed Jul. 21, 2011 in corresponding Japanese Patent Application No. 2009-139705.

* cited by examiner

PRIOR ART

Fig. 3

PRIOR ART

Fig. 4

PRIOR ART

LITHOGRAPHIC APPARATUS AND METHOD

This application claims priority and benefit under 35 U.S.C. §119(e) to U.S. Provisional Patent Application No. 61/129,314, entitled "Lithographic Apparatus and Method", filed on Jun. 18, 2008. The content of that application is incorporated herein in its entirety by reference.

FIELD

The present invention relates to a lithographic apparatus and a method of compensating for local heat load variations.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
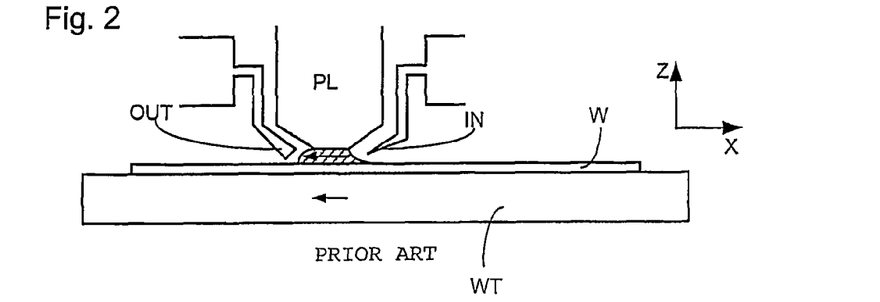
FIGS. 2 and 3 depict a liquid supply system for use in a lithographic projection apparatus.
Figure 3:
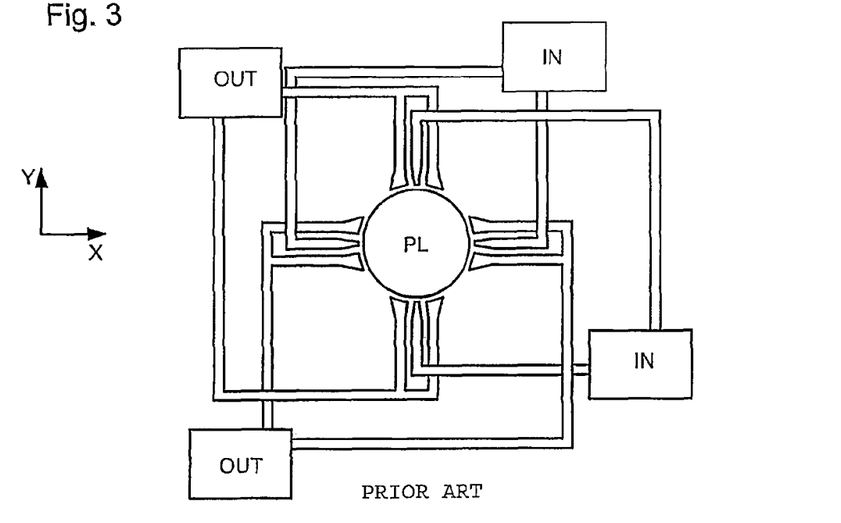

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
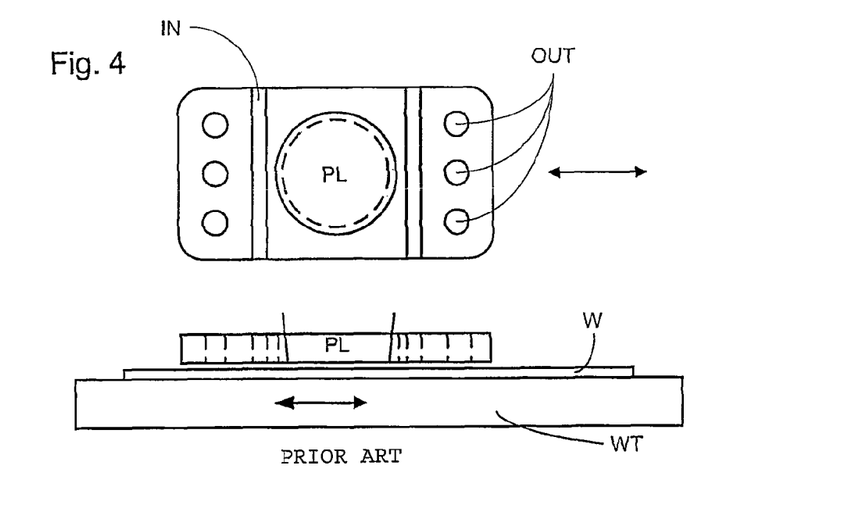
FIG. 4 depicts a further liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. U.S. 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way.

SUMMARY

In an immersion lithographic apparatus, thermal gradients in the final element of the projection system can occur and introduce imaging aberrations. The thermal gradients may be due to evaporation of the immersion liquid, e.g., water, from the final element of the projection system and the induced aberrations may be substantially eliminated by providing a hydrophobic coating on an outer surface of the final element. The coating reduces the amount of the immersion liquid sticking to the final element and hence the amount of evaporation therefrom.

It is desirable, for example, to provide an apparatus in which thermal gradients in the final element of the projection system in a lithographic apparatus can be controlled and/or reduced.

According to an aspect of the invention, there is provided a lithographic projection apparatus comprising:

a projection system configured to project a patterned beam onto a substrate, the projection system having a final element;

a liquid handling system configured to supply an immersion liquid to a space between the final element and the substrate;

a plurality of independently controllable heating and/or cooling devices thermally coupled to the final element, the heating and/or cooling devices being spaced apart; and a control system coupled to the plurality of heating and/or cooling devices and configured to control separately ones of the heating and/or cooling devices to maintain a desired spatial temperature profile in the final element.

According to an aspect of the invention, there is provided a method of compensating for a local thermal load in an immersion lithographic projection apparatus comprising a projection system having a final element and configured to project an image onto a substrate, the method comprising:

controlling a plurality of spaced-apart heating and/or cooling devices thermally coupled to the final element to maintain a desired spatial temperature profile in the final element.

According to an aspect of the invention, there is provided a device manufacturing method comprising:

projecting an image through an immersion fluid onto a substrate using a projection system having a final element; and controlling a plurality of spaced-apart heating and/or cooling devices thermally coupled to the final element to maintain a desired spatial temperature profile in the final element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
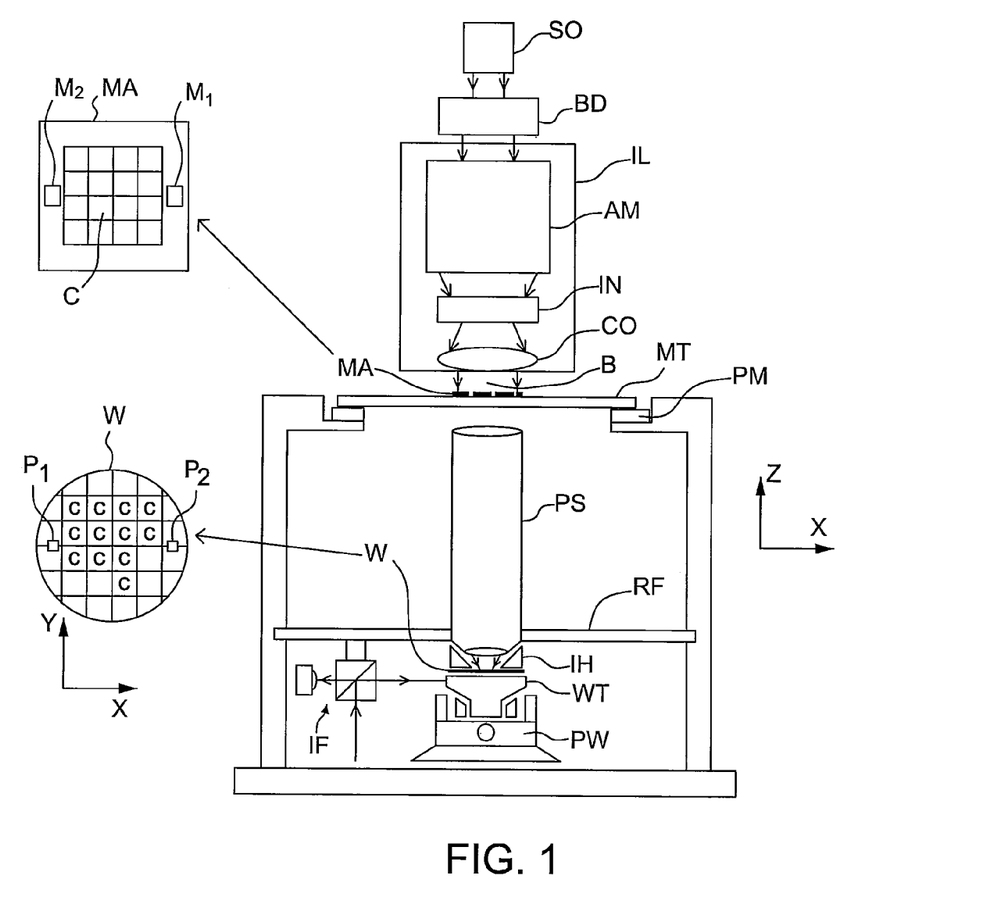
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
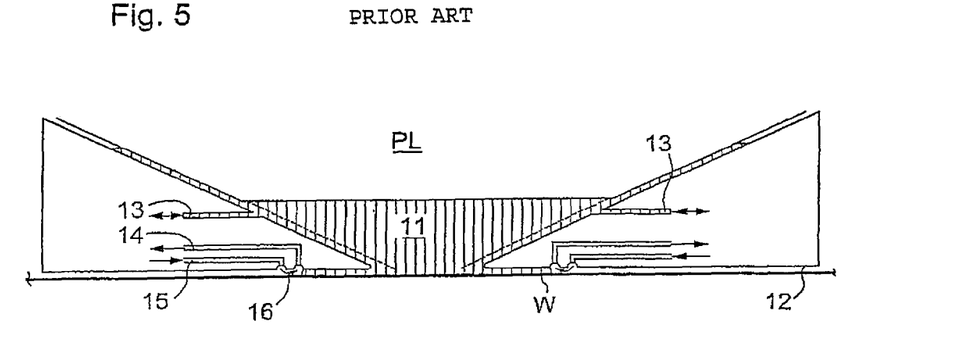
FIG. 5 depicts, in cross-section, a barrier member which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. U.S. 2004-0207824.

FIG. 5 schematically depicts a localized liquid supply system with a barrier member 12, IH. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, N$_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. U.S. 2004-0207824.

Other arrangements are possible and, as will be clear from the description below, an embodiment of the present invention may use any type of liquid handling system. An embodiment of the invention is particularly relevant to use with any localized liquid supply system as the liquid handling system.

Figure 6:
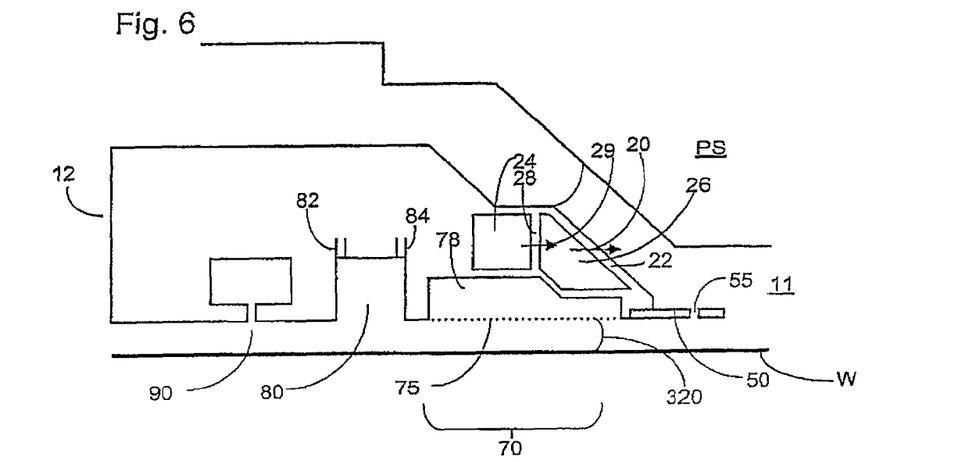
FIG. 6 depicts, in cross-section, another barrier member which may be used in an embodiment of the present invention.

FIG. 6 illustrates a barrier member 12 which is part of a liquid handling system. The barrier member 12 extends around the periphery (e.g., circumference) of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier could also be other shapes so long as it has an opening through which the projection beam may pass out from the final element of the projection system PS. The opening may be centrally located. Thus, during exposure, the projection beam may pass through liquid contained in the opening of the barrier member and onto the substrate W. The barrier member 12 may be, for example, substantially rectangular and may not be necessarily the same shape as the final element of the projection system PS is at the height of the barrier member 12.

The function of the barrier member 12 is at least partly to maintain or confine liquid in the space between the projection system PS and the substrate W so that the projection beam may pass through the liquid. The top level of liquid is simply contained by the presence of the barrier member 12. The level of liquid in the space is maintained such that the liquid does not overflow over the top of the barrier member 12.

The immersion liquid is provided to the space 11 by the barrier member 12 (thus the barrier member may be considered to be a fluid handling structure). A passageway or flow path for immersion liquid passes through the barrier member 12. Part of the flow path is comprised by a chamber 26. The chamber 26 has two side walls 28, 22. Liquid passes through the first side wall 28 into chamber 26 from chamber or outlet 24 and then through the second side wall 22 into the space 11. A plurality of outlets 20 provide the liquid to the space 11. The liquid passes through through-holes 29, 20 in side walls 28, 22 respectively prior to entering the space 11. The location of the through holes 20, 29 may be irregular.

A seal is provided between the bottom of the barrier member 12 and the substrate W. In FIG. 6 a seal device is configured to provide a contactless seal and is made up of several components. Radially outwardly from the optical axis of the projection system PS, there is provided a (optional) flow control plate 50 which extends into the space (though not into the path of the projection beam) which helps maintain substantially parallel flow of the immersion liquid out of outlet 20 across the space. The flow control plate 50 has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an extractor assembly 70 to extract liquid from between the barrier member 12 and the substrate W and/or the substrate table WT. The extractor assembly 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. The inlet 82 may be radially outwardly positioned with respect to the outlet 84. Radially outwardly of the recess 80 may be a gas knife 90. An arrangement of the extractor, recess and gas knife is disclosed in detail in United States patent application publication no. U.S. 2006/0158627. However, in that document the arrangement of the extractor assembly is different.

The extractor assembly 70 comprises a liquid removal device or extractor or inlet such as the one disclosed in United States patent application publication no. U.S. 2006-0038968. Any type of liquid extractor may be used. In an embodiment, the extractor assembly or liquid removal device 70 comprises an inlet which is covered in a porous material 75 which is used to separate liquid from gas to enable single-liquid phase liquid extraction. A chamber 78 downstream of the porous material 75 is maintained at a slight under pressure and is filled with liquid. The under pressure in the chamber 78 is such that the meniscuses formed in the holes of the porous material prevent ambient gas from being drawn into the chamber 78 of the extractor assembly 70. However, when the porous surface 75 comes into contact with liquid there is no meniscus to restrict flow and the liquid can flow freely into the chamber 78 of the extractor assembly 70. The porous surface 75 extends radially inwardly along the barrier member 12 (as well as around the space). The rate of extraction through the porous surface 75 varies according to how much of the porous material 75 is covered by liquid.

The porous material 75 has a large number of small holes each with a dimension, e.g. a width, such as a diameter, $d_{hole}$ in the range of 5 to 50 μm. The porous material may be maintained at a height in the range of 50 to 300 μm above a surface from which liquid is to be removed, e.g. the surface of a substrate W. In an embodiment, porous material 75 is at least slightly hydrophilic, i.e. having a contact angle of less than 90°, desirably less than 85° or desirably less than 80°, to the immersion liquid, e.g. water.

It may not always be possible to prevent gas being drawn into the liquid removal device but the porous material 75 will prevent large uneven flows that may cause vibration. Microsieves made by electroforming, photoetching and/or laser cutting can be used as the porous material 75. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During use (e.g., during the time that the substrate moves under the barrier member 12 and projection system PS), a meniscus 320 extending between the substrate W and the barrier member 12 is provided.

Although not specifically illustrated in FIG. 6, the liquid handling system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide a very large barrier member 12 so that there is hardly any pressure gradient over the periphery (e.g., circumference) of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic or hydrophobic coating. The coating may form a band around the top of the barrier member 12 surrounding the opening and/or around the last optical element of the projection system PS. The coating may be radially outward of the optical axis of the projection system. The liquidphobic or hydrophobic coating helps keep the immersion liquid in the space.

As discussed above, in an immersion lithographic apparatus, thermal gradients in the final element of the projection system FLE (see, e.g., FIG. 11) may occur due to evaporation of the immersion liquid from the final element and/or its mount. Such thermal gradients can introduce aberrations into the projection system due to the temperature dependence of the refractive index of the material from which the final element is made and/or, to a lesser extent, due to thermal expansion and contraction of the final element. The problem is particularly acute where, as is common, the final element is made of quartz, the refractive index of which has a high temperature dependence. The problem also occurs with other materials, e.g. $CaF_2$, albeit to a lesser extent. The problem of thermal gradients in the final element of the projection system may be ameliorated by providing a hydrophobic coating on the final element and/or its mount, to reduce the amount of the immersion liquid adhering to it and evaporating. Thus the amount of cooling can be reduced.

However, further control over the temperature uniformity of the final element of the projection system is desirable. In non-immersion lithographic apparatus, the projection system, including the final element, is thermally well-isolated from its surroundings and can be maintained at a substantially uniform constant temperature (save for the phenomenon of "lens heating" in which elements of the projection system absorb energy from the beam projected via the elements). However, in an immersion lithography apparatus, the thermal isolation of the projection system is broken by the immersion liquid which thermally couples the final element to its surroundings. Thus thermal gradients may be induced in the final element by a variety of sources. These may include: thermal gradients in a barrier member or other components of a liquid handling system; evaporation of immersion fluid from the thermal gradients in the immersion liquid itself, e.g. due to absorption of energy from a radiation beam, turbulence and/or evaporation; thermal gradients in the substrate, e.g. due to absorption of energy from a radiation beam; and/or any other sources of heating or cooling that may be present.

Accordingly, an embodiment of the invention comprises a lithographic projection apparatus comprising: a projection system configured to project a patterned beam onto a substrate, the projection system having a final element; a liquid handling system configured to supply an immersion liquid to a space between the final element and the substrate; a plurality of independently controllable heating and/or cooling devices thermally coupled to the final element, the heating and/or cooling devices being spaced apart; and a control system coupled to the plurality of heating and/or cooling devices and configured to control separately ones of the heating and/or cooling devices to maintain a desired spatial temperature profile in the final element.

The heating and/or cooling devices can therefore provide and/or remove heat at different positions proximate the final element so that a desired temperature profile is maintained in the final element of the projection system, for example to compensate for the increased thermal coupling between the final element and its environment. In a dynamic situation, the desired spatial temperature profile is the setpoint, or target, of the control system and may not be met continuously.

Where the liquid handling system comprises a barrier member at least partly surrounding the space, a plurality of heating and/or cooling devices are desirably provided on the barrier member. In particular, if the barrier member has a plurality of fluid conduits extending therethrough, the plurality of heating and/or cooling devices are desirably located in correspondence with at least some of the fluid conduits. The fluid conduits may include a plurality of two-phase extraction conduits that are arranged to extract a mixture of immersion liquid and gas in which case at least one of the plurality of heating and/or cooling devices is desirably located in proximity to each of the two-phase extraction conduits. Evaporation of the immersion liquid in a two-phase extraction channel can be a significant source of spatially and temporally varying cooling loads proximate to the final element of the projection system. It is therefore desirable to locate the heating and/or cooling devices close to such conduits.

In an embodiment of the invention, the plurality of heating and/or cooling devices are provided to or on the final element of the projection system, or to or on a mount of the final element, or to or on the projection system.

A plurality of temperature sensors may be provided, to measure the temperature of the final element or its environment. In particular, for example, the number of temperature sensors can be equal to the number of heating and/or cooling devices and one temperature sensor can be located proximate each heating and/or cooling device. Each temperature sensor can comprise a plurality of temperature sensing elements. The control system can therefore be arranged as a feedback loop, or a plurality of feedback loops, so as to respond to changes in the temperature profile of the final element or its environment.

If the lithographic apparatus has a barrier member, at least one of the plurality of temperature sensors may be embedded in material of the barrier member. Such an arrangement can be desirable if the barrier member is a source of non-uniform thermal loads and enables the control system to respond directly to changes in the thermal load. In an embodiment, the temperature sensors are between the heating elements and the final element.

The control system can comprise a plurality of control circuits equal in number to the heating and/or cooling devices, each of the control circuits being connected to a respective one of the heating and/or cooling devices. It can also comprise inter-connections between at least some of the plurality of control circuits and/or comprise a limiting circuit to limit the total thermal output of the plurality of heating and/or cooling devices. Where a plurality of temperature sensors is provided, each control circuit is desirably responsive to a respective one of the plurality of temperature sensors.

Alternatively or additionally, the control system can comprise a control circuit arranged to control a plurality of the heating and/or cooling devices. In general, at one extreme the control system can be a single multiple-input multiple-output controller arranged to control all heating and/or cooling devices and responsive to all inputs, e.g. from multiple temperature sensors, and at the other extreme separate control circuits may be provided for each heating and/or cooling device and responsive to a single input, e.g. a single temperature sensor. Between these extremes, various arrangements are possible, for example a mixture of control loops controlling single heating and/or cooling devices and control circuits controlling multiple heating and/or cooling devices. In general it is desirable to have an independently controllable heating and/or cooling device for each independent thermal load, e.g. a fluid conduit in a barrier member. However, where two or more thermal loads are linearly correlated a single control circuit or output may be applied to two or more heating or cooling devices corresponding to those thermal loads that have heating and/or cooling powers correlated in the same way as the respective thermal loads.

The control system can be or include a feedforward control circuit. For example where the lithographic apparatus has a positioner to move the substrate relative to the projection system, the control system can be arranged to control the heating and/or cooling devices in response to the direction of relative movement of the substrate. This is desirable in cases where the thermal load is dependent on the direction and/or speed of movement of the substrate. For example, if the liquid supply system includes a plurality of liquid extraction conduits, the fluid flow through the different conduits, and hence the thermal load provided by those conduits, may be strongly dependent on the direction of movement of the substrate.

In an embodiment of the invention, the target for the control system is to maintain a uniform temperature distribution in the final element. In this way the introduction of aberrations due to a non-uniform temperature distribution is avoided. In an embodiment of the invention, the target for the control system is to maintain a non-uniform temperature distribution in the final element. The non-uniform temperature distribution in the final element can be effective to impart a desired aberration to the radiation beam projected by the projection system. The desired aberration can, for example, be used to compensate for an aberration introduced somewhere else in the apparatus.

The heating and/or cooling devices may be of any suitable type, such as electrical resistance heaters, Peltier coolers or cooling channels. Electrical resistance heaters can be arranged to respond rapidly to provide a heat load to compensate for a changing cooling load, e.g. from a change in the ratio of liquid:gas in two-phase flow in an extraction channel caused by a change in operating conditions.

Figure 7:
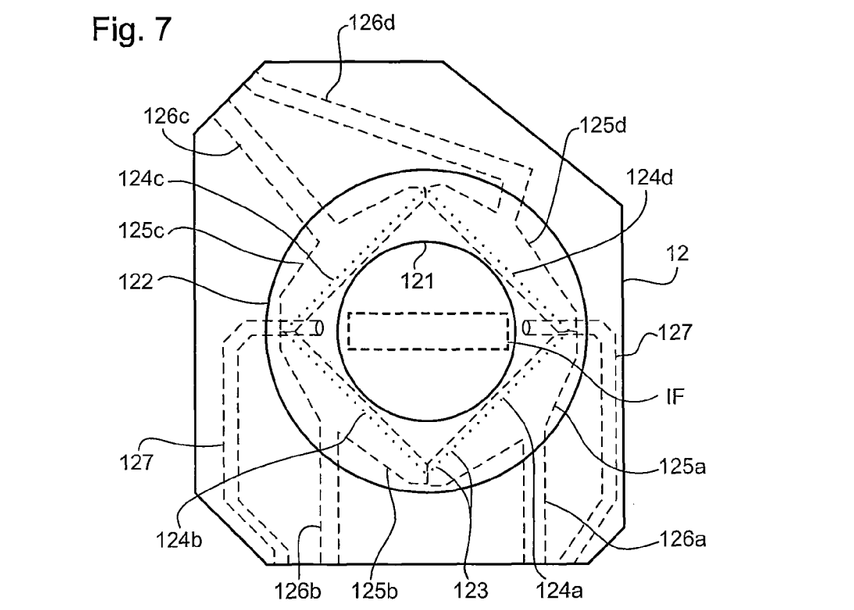
FIG. 7 depicts, in plan, a barrier member which may be used in an embodiment of the invention, showing fluid conduits therein.

A particular embodiment of the invention will now be described. FIG. 7 shows in plan a barrier member 12 of a liquid handling system of a lithographic apparatus according to an embodiment of the invention. The barrier member 12 defines an aperture 121 which has substantially conical sidewalls 122 to receive the lower part of the projection system (not shown in this figure), in particular the final element thereof. The projection system projects the desired pattern into an image field IF below the barrier member 12. In the lower surface of barrier member 12, a plurality of apertures 123 are provided. The apertures 123 are arranged in four rows 124*a-d* which in one embodiment together form a square around the aperture 121. Other arrangements of the apertures, such as rectangles, diamonds, and rhombuses, can be used. The rows of apertures can be curved, e.g. forming a generally diamond-like shape with concave sides. Each row of the apertures 123 opens into a respective chamber or manifold 125*a-d* (shown in phantom) within the body of the barrier member 12. Respective extraction conduits 126*a-d* provide a fluid connection between each manifold 125*a-d* and a respective connector (not shown) on the outer periphery of barrier member 12. Thereby, the manifolds 125*a-d* can be connected in use to a source of under-pressure, such as a vacuum pump (not shown), in order to extract immersion liquid that escapes under the barrier member, i.e. between the barrier member and the substrate.

When the lithographic apparatus is operating, both gas, e.g. air, and immersion liquid. e.g. water, are extracted through apertures 123, manifolds 125a-d and extraction conduits 126a-d so that there are four separate paths through the barrier member through which a two-phase flow of immersion liquid and gas can be extracted. The volume of the flow through each path and the ratio of liquid to gas in each path can vary over wide ranges. The variations in each path may not be correlated with variations in other paths. Factors which may affect the flow rates and liquid:gas ratios in the different paths include the direction and speed of the substrate relative to the barrier member, and the position of the barrier member relative to the edge of the substrate. Other factors can affect the flow rates.

Because the flow through the manifolds 125a-d and conduits 126a-d is two-phase and the gas is not saturated, a significant amount of evaporation of the immersion liquid can occur. This evaporation causes localized cooling of the barrier member due to the latent heat of evaporation of the immersion liquid. Also shown in FIG. 7 are supply conduits 127 through which immersion liquid can be supplied to the space surrounded by the barrier member 12. The immersion fluid is advantageously supplied at a known substantially constant temperature but that temperature may vary from the temperature of the immersion liquid already in the space or that of the barrier member. Thus the supply conduits 127 can contribute to temperature gradients in the barrier member 12. Other possible contributors to temperature gradients in the barrier member 12 might include supply conduits to gas knives and/or gas bearings in the barrier member, other utility conduits, temperature gradients in the environment around the barrier member 12, and localized absorption of a radiation beam in the immersion liquid and/or the substrate. The localized cooling of the barrier member 12 can give rise to temperature gradients in the final element of the projection system, its mount and/or the casing of the projection system, in particular through the thermal coupling of the barrier member to the projection system by the immersion liquid but also through other heat conduction mechanisms, such as radiation and convection.

Temperature gradients in the final element of the projection system and/or its mount may affect the image projected by the projection system. In particular, if the final element is a refractive element made of a material having a refractive index that has significant temperature dependence, the temperature gradients might induce refractive index gradients that alter the optical power of the element and introduce aberrations. Temperature gradients might alter the surface figure of the final element of the projection system having a similar effect but in a refractive element this is often a smaller effect than that caused by refractive index variation. Temperature variations in the mount of the final element may affect the final element position and/or orientation.

Figure 8:
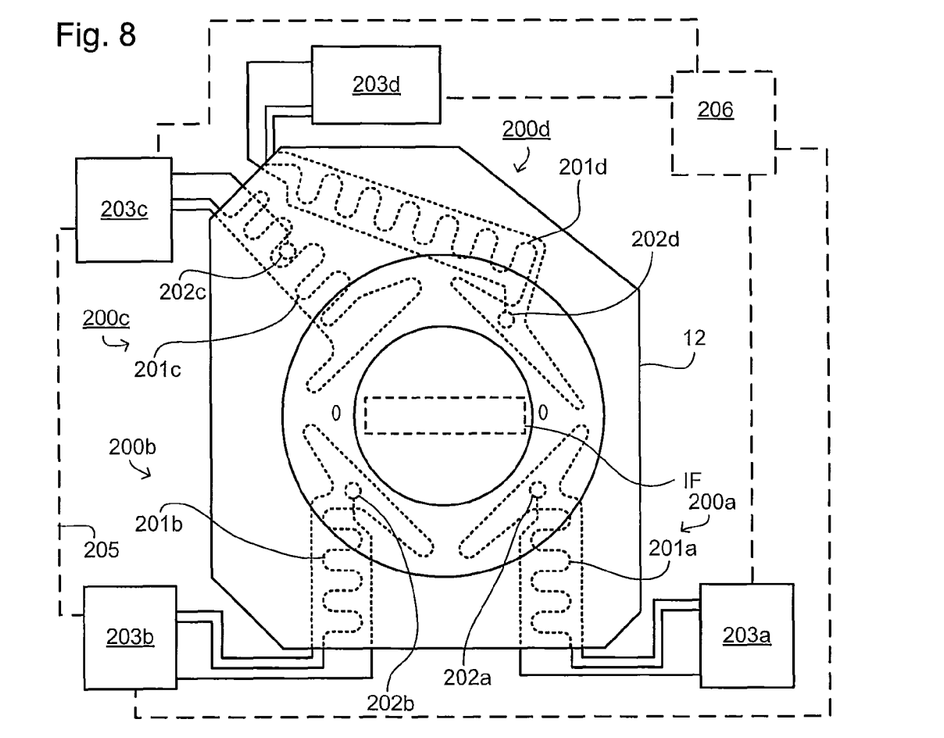
FIG. 8 depicts, in plan, a barrier member in accordance with an embodiment of the invention, showing heating devices and temperature sensors therein.

To address the temperature gradients caused by the two-phase extraction paths, a plurality of independently controllable heating circuits 200 are provided, as shown in FIG. 8 which is a plan view of the barrier member 12 of FIG. 7 but showing the heating elements rather than the extraction paths. In this embodiment, four independent heating circuits 200a-200d are provided, one for each of the extraction flow paths. In other embodiments more or fewer independent circuits are provided, the exact number will depend on the shape of the temperature distribution that would otherwise exist, which in turn depends on the number and distribution of heating and/or cooling loads in the barrier member. Further, some or all of the circuits 200 may be configured instead or additionally to provide cooling.

Each heating circuit 200a-d comprises a heating element 201, e.g. a resistive heating wire, a temperature sensor 202 and a control circuit 203. The heating elements 201 are arranged in the barrier member so as to heat what would otherwise be the coolest parts of the barrier member. In an embodiment, heating element 201 is arranged to overlay the cooling source, e.g. to follow the path of the extraction conduit 126 and manifold 125. The output power of heating element 201 can be arranged to vary along its length in correspondence to the amount of cooling experienced at different positions. In the case of a resistive heating wire, this can be achieved by varying the resistance of the wire along its length or by varying the spacing between loops of the wire. The heating elements 210a-d can be segmented, with different segments having different powers and optionally each segment can be independently controllable.

Each temperature sensor 202 is positioned at a convenient location subject to the cooling load. In an embodiment, the temperature sensor is located at or near the location of the greatest cooling load. Temperature sensor 202 can be a CMOS integrated circuit sensor, platinum chip detector or a resistive temperature detector, for example in a surface mount package. Temperature sensor 202 can be a point sensor in which case it is likely that more than one temperature sensor per heating circuit will be needed. For any particular arrangement of heating elements 201, the thermal response may be better if the response is controlled by the signal from three temperature sensors 202 in a heating circuit rather than just one temperature sensor. An average of the sensors should be taken. The sensors may be connected in parallel or in series but this does not really affect their performance. Either way will give an average of the temperature measurement. In an embodiment, a temperature sensor could be a ribbon sensor which by its nature averages the temperature over an area. The sensor could, for example, be a NTC sensor (that is a negative temperature coefficient sensor) which is surface mounted. The temperature sensor 202 is advantageously mounted as close as possible to the final element FLE of the projection system, for example in or on the upper surface of the barrier member 12. The temperature sensor may instead or additionally be embedded in the body of the barrier member 12. Desirably, the temperature sensor 202 of a given heating circuit 200 is between the heating element 201 of that heating circuit and the final element of the projection system.

Each control circuit, which may also be referred to as a controller, can be a simple feedback loop with a fixed setpoint but, as discussed below, in other embodiments of the invention other types of control circuit can be advantageous. Rather than being entirely independent, the control circuits 203 may be interconnected, e.g. by optional inter-connection 205, in accordance with any cross coupling of the cooling loads in the barrier member 12. A limit circuit 206 to limit the total amount of heat supplied to the barrier member 12 can be provided. Where multiple cooling loads are linearly correlated a single controller may control multiple heaters of powers in proportion to the different cooling loads. A single multiple-input multiple-output controller can also be used. Combinations of independent single loop controllers, interconnected controllers and multiple-input, multiple-output controllers can be used as suited to the particular embodiment.

The controllers can alternatively or in addition be based on feedforward control principles, for example based on movement of the substrate table and/or the rate of supply of immersion liquid. Control of heaters can alternatively or in addition be based on measurement of flow through the extraction or supply conduits generating the cooling loads. Where multiple control circuits or controllers are provided they together constitute a control system. Likewise a specific multiple-input, multiple-output controller can be regarded as a control system. In either case, the control system can be implemented in hardware or software. A master-slave control system, in which a slave feedback loop aims to meet a set point set by the master circuit based on some other parameter of the apparatus, can be used.

Figure 9:
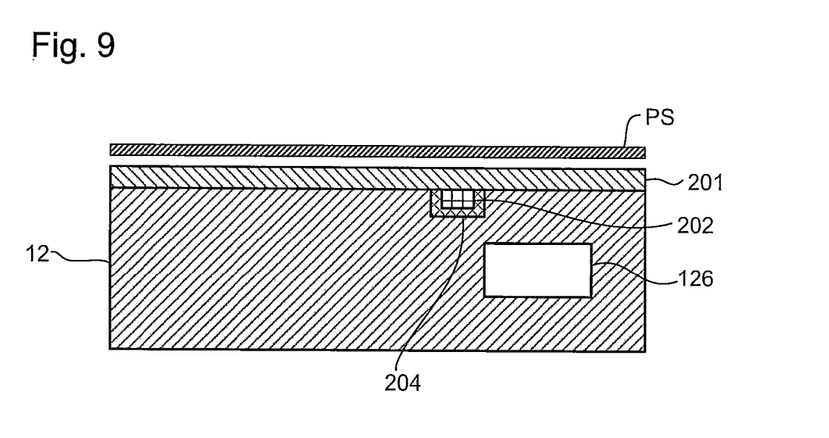
FIG. 9 depicts, in cross-section, a part of the barrier member of FIG. 8 and the projection system.
Figure 10:
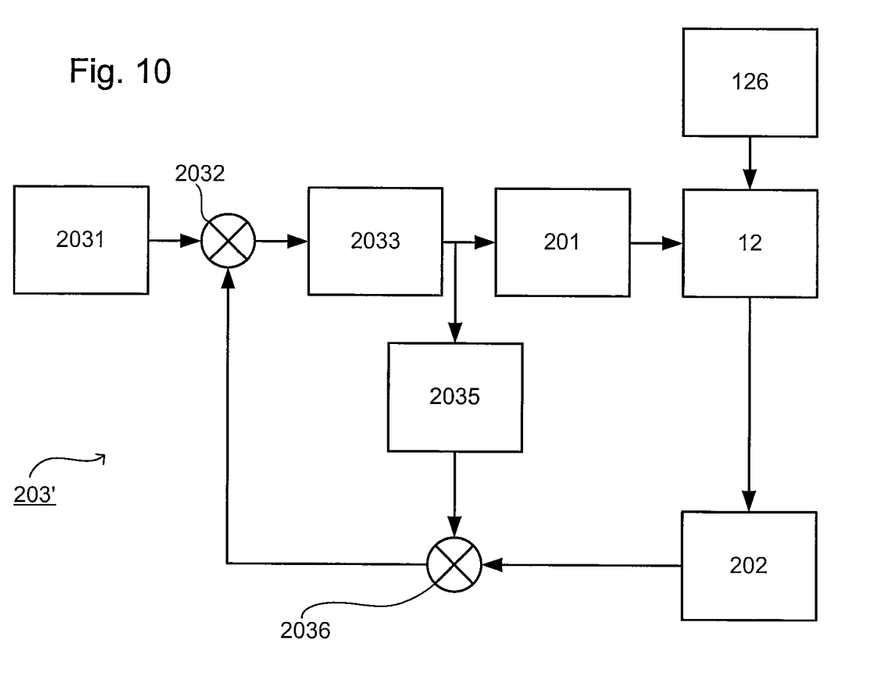
FIG. 10 depicts a control system in accordance with an embodiment of the invention.

In an embodiment of the invention, space constraints prevent location of the temperature sensor of a heating circuit above the heating element. As shown in FIG. 9, the temperature sensor 202 is embedded in the surface of the barrier member 12 in contact with the heating element 201 and close to the conduit 126 that provides the cooling load. A thermally conductive paste 204 may be provided to assist in thermally coupling the temperature sensor 202 to the barrier member 12. The casing of the projection system PS or the final element FLE faces the heating element 201 across a small gap, which may be filled with gas, e.g. air, or immersion liquid. The thermal load, whether heating or cooling, on the projection system PS is determined by the temperature of the upper surface of the heating element 201, which is not directly measured by the temperature sensor 202. The temperature of the upper surface of the heating element 201 may not be linearly related to the temperature sensor but can be determined using a model from the momentary power output of the heating element 201. A modified circuit system 203' for use with this arrangement is shown in FIG. 10.

Control system 203' takes the general form of a feedback loop with an additional correction which will be described below. The system comprises:
  a setpoint generator 2031 which sets the desired temperature for the upper surface of the barrier member 12;
  a subtractor 2032 which subtracts a corrected temperature signal from the set point to provide an error signal;
  a controller 2033 which receives the error signal and generates a control signal which is applied to heater 201;
  a model 2035 which also receives the control signal that is applied to the heater 201 and determines a correction signal predictive of the difference between the temperature recorded by sensor 202 and the actual temperature of the surface of the barrier member facing the projection system PS; and
  an adder 2036 which adds the correction signal to the temperature signal provided by the temperature sensor 202 to generate the corrected temperature signal.

The model 2035 performs calculations necessary to predict the temperature difference between the temperature recorded by sensor 202 and the actual temperature of the surface of the barrier member facing the projection system PS. The exact calculations to be performed will depend on the details of the apparatus, in particular the position of the temperature sensor, the type of the heater and materials and thicknesses of any layers above or below the heating element 201. The necessary mathematical equations to be applied can be generated on the basis of theory and/or empirical measurements.

Figure 11:
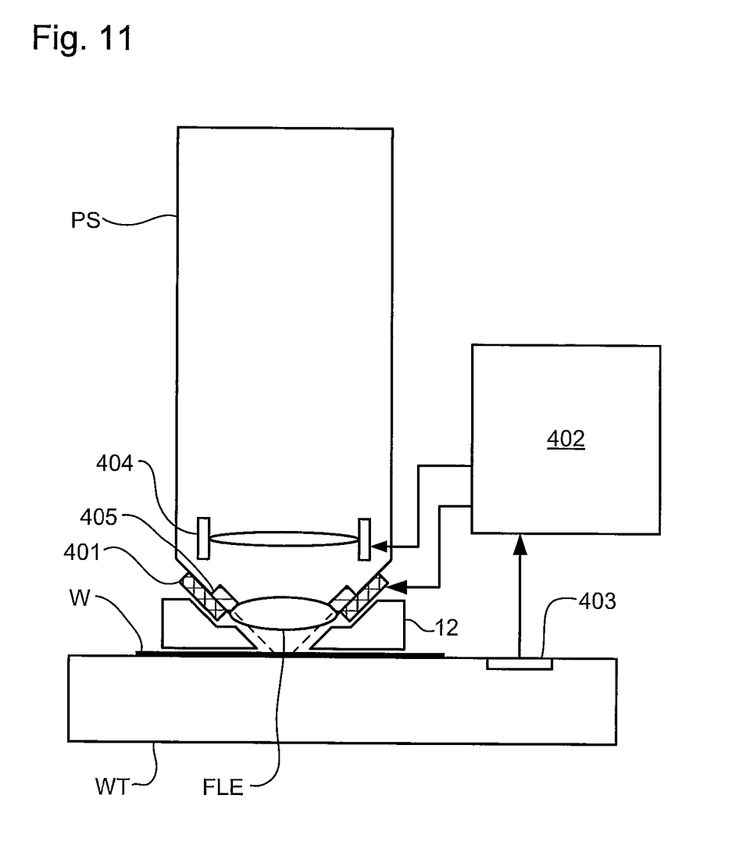
FIG. 11 depicts relevant parts of a further embodiment of the invention.

A further particular embodiment of the invention is depicted schematically in FIG. 11. In this embodiment the corrective heat is applied by segmented heater 401 directly to the projection system PS, the final element FLE, and/or the mount 405 of the final element FLE. Segmented heater 401 can have two or more independently controllable segments. In particular embodiments, 3, 4 or 8 segments are employed. The number and/or size of the segments can be selected according to the number, size and locations of cooling sources in the vicinity of the final element FLE, especially in the barrier member 12, and/or the type of aberrations to be controlled. In the latter case, it can be advantageous to provide a number of segments that is even or a multiple of 3 and to evenly space the segments around the final element.

Rather than or in addition to use of the segmented heater 401 to reduce temperature gradients in the final element FLE, the apparatus of FIG. 11 may be particularly suited to control temperature gradients to provide a desired aberration in the final element, e.g. to compensate for other aberrations in the projection system or to provide a desired distortion of the projected image. To this end, controller 402 which controls the heating power applied to the different segments of segmented heater 401 may be responsive to an aberration sensor 403 provided on the substrate table WT and/or other source of information on aberration, such as a lens heating model. Controller 402 can also be configured to control another adjustable element 404 provided in the projection system, in which case the control applied to segmented heater 401 can take account of the corrections effected by the other adjustable element 404. This approach of introducing desired aberrations via induced temperature gradients in the final element of the projection system may also be employed where the controlled heating element is provided in the barrier member or some other part of a liquid supply and/or management system, such as that described above with reference to FIGS. 7 to 10.

According to an embodiment, there is provided a lithographic projection apparatus comprising a projection system configured to project a patterned beam onto a substrate, the projection system having a final element, a liquid handling system configured to supply an immersion liquid to a space between the final element and the substrate, a plurality of independently controllable heating and/or cooling devices thermally coupled to the final element, the heating and/or cooling devices being spaced apart, and a control system coupled to the plurality of heating and/or cooling devices and configured to control separately ones of the heating and/or cooling devices to maintain a desired spatial temperature profile in the final element.

In an embodiment, the liquid handling system comprises a barrier member at least partly surrounding the space, the barrier member comprising the plurality of heating and/or cooling devices.

In an embodiment, the barrier member has a plurality of fluid conduits extending therethrough and wherein the plurality of heating and/or cooling devices are located in correspondence with at least some of the fluid conduits.

In an embodiment, the fluid conduits include a plurality of extraction conduits that are arranged to extract a mixture of immersion liquid and gas and at least one of the plurality of heating and/or cooling devices is located in proximity to each of the extraction conduits.

In an embodiment, the plurality of heating and/or cooling devices are provided to or on the final element, or to or on a mount of the final element, or to or on the projection system.

In an embodiment, the apparatus further comprises a plurality of temperature sensors.

In an embodiment, the number of temperature sensors is equal to the number of heating and/or cooling devices and one temperature sensor is located proximate each heating and/or cooling device.

In an embodiment, each temperature sensor comprises a plurality of temperature sensing elements.

In an embodiment, at least one of the plurality of temperature sensors is embedded in material of the barrier member.

In an embodiment, at least one of the plurality of temperature sensors is between the heating and/or cooling devices and the final element.

In an embodiment, the control system comprises a plurality of control circuits equal in number to the heating and/or cooling devices, each of the control circuits connected to a respective one of the heating and/or cooling devices.

In an embodiment, the control system further comprises inter-connections between at least some of the plurality of control circuits.

In an embodiment, the control system further comprises a limiting circuit to limit the total thermal output of the plurality of heating and/or cooling devices.

In an embodiment, each control circuit is responsive to a respective one of the plurality of temperature sensors.

In an embodiment, the control system comprises a control circuit arranged to control a plurality of the heating and/or cooling devices.

In an embodiment, the apparatus further comprises a positioner configured to move the substrate relative to the projection system and wherein the control system is arranged to control the heating and/or cooling devices in response to the direction of relative movement of the substrate.

In an embodiment, the control system is configured to maintain a uniform temperature distribution in the final element.

In an embodiment, the control system is configured to maintain a non-uniform temperature distribution in the final element.

In an embodiment, the non-uniform temperature distribution in the final element is effective to impart a desired aberration to a radiation beam projected by the projection system.

In an embodiment, the desired aberration is effective to at least partially compensate for an aberration caused by another element of the projection system than the final element.

In an embodiment, the heating and/or cooling devices each comprise an electrical resistance heater.

According to an embodiment, there is provided a method of compensating for a local thermal load in an immersion lithographic projection apparatus comprising a projection system having a final element and configured to project an image onto a substrate, the method comprising controlling a plurality of spaced-apart heating and/or cooling devices thermally coupled to the final element to maintain a desired spatial temperature profile in the final element.

In an embodiment, the desired spatial temperature profile is a uniform temperature profile.

In an embodiment, the desired spatial temperature profile is a non-uniform temperature profile.

In an embodiment, the non-uniform temperature profile is effective to impart a desired aberration to a radiation beam projected by the projection system.

According to an embodiment, there is provided a device manufacturing method comprising projecting an image through an immersion fluid onto a substrate using a projection system having a final element, and controlling a plurality of spaced-apart heating and/or cooling devices thermally coupled to the final element to maintain a desired spatial temperature profile in the final element.

In an embodiment, the desired spatial temperature profile is a uniform temperature profile.

In an embodiment, the desired spatial temperature profile is a non-uniform temperature profile.

In an embodiment, the non-uniform temperature profile is effective to impart a desired aberration to a radiation beam projected by the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
   a projection system configured to project a patterned beam onto a substrate, the projection system having a final element;
   a liquid handling system configured to supply an immersion liquid to a space between the final element and the substrate, the liquid handling system comprising a barrier member at least partly surrounding the space, the barrier member including a plurality of extraction conduits that are arranged to extract a mixture of immersion liquid and gas, a surface of the liquid handling system facing a surface of the projection system across a gap formed therebetween;
   a plurality of independently controllable heating and/or cooling devices thermally coupled to the final element, the heating and/or cooling devices being spaced apart and at least one of the plurality of heating and/or cooling devices located in proximity to each of the extraction conduits and located in a surface of the gap; and
   a control system coupled to the plurality of heating and/or cooling devices and configured to control separately ones of the heating and/or cooling devices to maintain a desired spatial temperature profile in the final element.

2. The lithographic apparatus of claim 1, wherein the barrier member comprises the plurality of heating and/or cooling devices.

3. The lithographic apparatus of claim 2, wherein the barrier member further comprises a plurality of fluid conduits extending therethrough and wherein the plurality of heating and/or cooling devices are located in correspondence with at least some of the fluid conduits.

4. The lithographic apparatus of claim 1, wherein the plurality of heating and/or cooling devices are provided to or on the final element, or to or on a mount of the final element, or to or on the projection system.

5. The lithographic apparatus of any one of claims 1 to 4, further comprising a plurality of temperature sensors.

6. The lithographic apparatus of claim 5, wherein the number of temperature sensors is equal to the number of heating and/or cooling devices and one temperature sensor is located proximate each heating and/or cooling device.

7. The lithographic apparatus of claim 5, wherein each temperature sensor comprises a plurality of temperature sensing elements.

8. The lithographic apparatus of claim 5, wherein the barrier member comprises the plurality of heating and/or cooling devices and wherein at least one of the plurality of temperature sensors is embedded in material of the barrier member.

9. The lithographic apparatus according to claim 5, wherein at least one of the plurality of temperature sensors is between the heating and/or cooling devices and the final element.

10. The lithographic apparatus of claim 1, wherein the control system comprises a plurality of control circuits equal in number to the heating and/or cooling devices, each of the control circuits connected to a respective one of the heating and/or cooling devices.

11. The lithographic apparatus of claim 10, wherein the control system further comprises inter-connections between at least some of the plurality of control circuits.

12. The lithographic apparatus of claim 10, wherein the control system further comprises a limiting circuit to limit the total thermal output of the plurality of heating and/or cooling devices.

13. The lithographic apparatus of any one of claims 10 to 12, further comprising a plurality of temperature sensors, wherein the number of the temperature sensors is equal to the number of heating and/or cooling devices and one temperature sensor is located proximate each heating and/or cooling device and wherein each control circuit is responsive to a respective one of the plurality of temperature sensors.

14. The lithographic apparatus of any claim 1, wherein the control system comprises a control circuit arranged to control a plurality of the heating and/or cooling devices.

15. The lithographic apparatus of claim 1, further comprising a positioner configured to move the substrate relative to the projection system and wherein the control system is arranged to control the heating and/or cooling devices in response to the direction of relative movement of the substrate.

16. The lithographic apparatus of claim 1, wherein the control system is configured to maintain a uniform temperature distribution in the final element.

17. The lithographic apparatus of claim 1, wherein the control system is configured to maintain a non-uniform temperature distribution in the final element.

18. The lithographic apparatus of claim 17, wherein the non-uniform temperature distribution in the final element is effective to impart a desired aberration to a radiation beam projected by the projection system.

19. The lithographic apparatus of claim 18, wherein the desired aberration is effective to at least partially compensate for an aberration caused by another element of the projection system than the final element.

20. The lithographic apparatus of any one of claims 1 to 3, wherein the heating and/or cooling devices each comprise an electrical resistance heater.

21. The lithographic apparatus of claim 1, wherein in plan, at least one of the heating and/or cooling devices in the surface of the gap is located to extend along and correspond to a path of at least one of the extraction conduits within the liquid handling system.

22. A method of compensating for a local thermal load in an immersion lithographic projection apparatus comprising a projection system having a final element and configured to project an image onto a substrate, and a liquid handling system configured to supply an immersion liquid to a space between the final element and the substrate, a surface of the liquid handling system facing a surface of the projection system across a gap formed therebetween, the method comprising:
   controlling a plurality of spaced-apart heating and/or cooling devices thermally coupled to the final element to maintain a desired spatial temperature profile in the final element; and
   extracting a mixture of immersion liquid and gas through a plurality of extraction conduits of a barrier member of the liquid handling system, wherein at least one of the plurality of heating and/or cooling devices is located in proximity to each of the extraction conduits and located in a surface of the gap.

23. The method according to claim 22, wherein the desired spatial temperature profile is a uniform temperature profile.

24. The method according to claim 22, wherein the desired spatial temperature profile is a non-uniform temperature profile.

25. The method according to claim 24, wherein the non-uniform temperature profile is effective to impart a desired aberration to a radiation beam projected by the projection system.

26. The method of claim 22, wherein in plan, at least one of the heating and/or cooling devices in the surface of the gap is located to extend along and correspond to a path of at least one of the extraction conduits within the liquid handling system.

27. A device manufacturing method in an immersion lithographic projection apparatus comprising a projection system, a plurality of temperature sensors, and a plurality of spaced-apart heating and/or cooling devices thermally coupled to a final element of the projection system, the method comprising:
supplying an immersion fluid to a space between the final element and a substrate using a fluid handling system, wherein, in plan, at least one of the heating and/or cooling devices is located to extend along and correspond to a path of a fluid extraction conduit within the fluid handling system;
projecting an image through the immersion fluid onto the substrate using the projection system;
measuring a temperature using at least one of the plurality of temperature sensors between the heating and/or cooling devices and the final element; and
controlling the heating and/or cooling devices, based on the measured temperature, to maintain a desired spatial temperature profile in the final element and control a temperature along the path of the fluid extraction conduit.

28. The method according to claim 27, wherein the desired spatial temperature profile is a uniform temperature profile.

29. The method according to claim 27, wherein the desired spatial temperature profile is a non-uniform temperature profile.

30. The method according to claim 29, wherein the non-uniform temperature profile is effective to impart a desired aberration to a radiation beam projected by the projection system.

* * * * *